United States Patent
Yoshikawa et al.

(10) Patent No.: US 10,137,496 B2
(45) Date of Patent: Nov. 27, 2018

(54) METAL WIRE ROD COMPOSED OF IRIDIUM OR IRIDIUM ALLOY

(71) Applicant: TANAKA KIKINZOKU KOGYO K.K., Chiyoda-ku, Tokyo (JP)

(72) Inventors: Akira Yoshikawa, Sendai (JP); Yuui Yokota, Sendai (JP); Muneki Nakamura, Hiratsuka (JP); Kunihiro Tanaka, Hiratsuka (JP); Tatsuya Nakazawa, Hiratsuka (JP); Koichi Sakairi, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 215 days.

(21) Appl. No.: 15/125,491

(22) PCT Filed: Mar. 23, 2015

(86) PCT No.: PCT/JP2015/058786
§ 371 (c)(1),
(2) Date: Sep. 12, 2016

(87) PCT Pub. No.: WO2015/146932
PCT Pub. Date: Oct. 1, 2015

(65) Prior Publication Data
US 2017/0072458 A1 Mar. 16, 2017

(30) Foreign Application Priority Data
Mar. 28, 2014 (JP) .................................. 2014-068445

(51) Int. Cl.
*C22C 5/04* (2006.01)
*C30B 15/08* (2006.01)
(Continued)

(52) U.S. Cl.
CPC ............ *B22D 11/005* (2013.01); *B22D 11/00* (2013.01); *B22D 11/001* (2013.01); *B22D 11/11* (2013.01);
(Continued)

(58) Field of Classification Search
CPC .. C22C 1/02; C22C 5/04; C30B 15/08; C30B 29/02
See application file for complete search history.

(56) References Cited

U.S. PATENT DOCUMENTS

| 2006/0197542 A1* | 9/2006 | Tanaka | G01R 3/00 324/755.11 |
| 2010/0239453 A1* | 9/2010 | Obata | B21C 1/003 420/461 |
| 2013/0213107 A1* | 8/2013 | Sakairi | C22C 5/04 72/274 |

FOREIGN PATENT DOCUMENTS

| EP | 2660341 A1 | 11/2013 |
| JP | 6-112262 A | 4/1994 |
(Continued)

OTHER PUBLICATIONS

International Search Report for PCT/JP2015/058786, dated Jun. 23, 2015.
(Continued)

*Primary Examiner* — Ngoc-Yen Nguyen
(74) *Attorney, Agent, or Firm* — Orrick, Herrington & Sutcliffe LLP; Joseph A. Calvaruso (57) ABSTRACT

The present invention provides a metal wire rod composed of iridium or an iridium alloy, wherein the number of crystal grains on any cross-section in a longitudinal direction is 2 to 20 per 0.25 mm$^2$, and the Vickers hardness at any part is 200 Hv or more and less than 400 Hv. The iridium wire rod is a material which is produced by a μ-PD method, and has low residual stress and which has a small change in the number (Continued)

of crystal grains and hardness even when heated to a temperature equal to or higher than a recrystallization temperature (1200° C. to 1500° C.). The metal wire rod of the present invention is excellent in oxidative consumption resistance under a high-temperature atmosphere, and mechanical properties.

7 Claims, 4 Drawing Sheets

(51) Int. Cl.
    *C30B 29/02* (2006.01)
    *C30B 29/52* (2006.01)
    *B22D 11/00* (2006.01)
    *C22C 1/02* (2006.01)
    *C22F 1/18* (2006.01)
    *B22D 11/11* (2006.01)
    *B22D 21/00* (2006.01)

(52) U.S. Cl.
    CPC .............. *B22D 21/005* (2013.01); *C22C 1/02* (2013.01); *C22C 5/04* (2013.01); *C22F 1/18* (2013.01); *C30B 15/08* (2013.01); *C30B 29/02* (2013.01); *C30B 29/52* (2013.01)

(56) References Cited

FOREIGN PATENT DOCUMENTS

| | | |
|---|---|---|
| JP | 2002-45905 A | 2/2002 |
| JP | 2003-53419 A | 2/2003 |
| JP | 2005-239535 A | 9/2005 |
| JP | 2009-35434 A | 2/2009 |
| JP | 2010-241663 A | 10/2010 |
| JP | 2012-36066 A | 2/2012 |
| JP | 2012-136733 A | 7/2012 |
| WO | 2009/107289 A1 | 9/2009 |

OTHER PUBLICATIONS

European Search Report for EP application No. 15769690.7, dated Nov. 17, 2017.
Chani, "Micro-Pulling-Down (μ-PD) and Related Growth Methods," Shaped Crystals, Growth by Micro-Pulling-Down Technique, Jan. 1, 2007, Springer, vol. XV, pp. 1-26, XP002775288.

* cited by examiner

EXAMPLE 8

→ LONGITUDINAL DIRECTION

COMPARATIVE EXAMPLE 8

→ LONGITUDINAL DIRECTION

METAL WIRE ROD COMPOSED OF IRIDIUM OR IRIDIUM ALLOY

TECHNICAL FIELD

The present invention relates to a metal wire rod composed of iridium or an iridium alloy, which is used in applications of ignition plug electrodes, sensor electrodes and the like and which is used in a high-temperature atmosphere.

BACKGROUND ART

As a metal wire rod to be used in electrodes for ignition plugs (central electrodes and earth electrodes) and various kinds of sensor electrodes, a metal wire rod composed of iridium or an iridium alloy (hereinafter, sometimes referred to as an "iridium wire rod") is known. Electrodes for ignition plugs are exposed to a high-temperature oxidation environment in a combustion chamber, and therefore may be consumed due to high-temperature oxidation. Iridium is one of precious metals, has a high melting point and good oxidation resistance, and therefore can be used for a long period of time even at a high temperature. In these applications, further improvement of durability in a high-temperature atmosphere is required. It has been a common practice for improvement of the durability of an iridium wire rod to appropriately alloy additive elements such as rhodium, platinum and nickel as adjustment of the material composition. However, deterioration of other properties cannot be prevented only by improvement based on composition adjustment by alloying, and improvement of the high-temperature oxidation resistance property by composition adjustment is also necessary.

As a method for improving the high-temperature properties of a material, an approach has been made from adjustment of a material structure besides adjustment of a composition (constituent elements). For example, the present applicant has disclosed a metal wire rod composed of iridium or an iridium alloy, wherein the abundance ratio of crystals oriented in the <100> direction that is a preferential direction during processing of the wire rod is intentionally increased with attention given to the crystal orientation of metal crystals that form the wire rod (Patent Document 1).

RELATED ART DOCUMENT

Patent Document

Patent Document 1: JP 2012-136733 A

SUMMARY OF THE INVENTION

Problems to be Solved by the Invention

Improvement of the high-temperature properties of metal wire rods by control of a material structure is not considered complete yet. In the iridium wire rod disclosed by the present applicant, the oxidative consumption amount in a high-temperature oxidizing atmosphere is reduced as compared to an iridium wire rod produced by conventional wire rod processing, and thus a certain effect is shown. However, an iridium wire rod having more satisfactory high-temperature properties is required because further improvement of high-temperature properties is required. For example, in ignition plug electrodes, extension of the durability life, and further improvement of durability, which corresponds to improvement of engine performance, are required. The present inventors point out that there is room for improvement in conventional iridium wire rods.

Accordingly, an object of the present invention is to provide a metal wire rod composed of iridium or an iridium alloy, which is excellent in properties such as oxidative consumption resistance under a high-temperature atmosphere, and mechanical properties, and a method for producing the metal wire rod.

Means for Solving the Problems

Studies by the present inventors show that in the damage mode of a metal mainly composed of iridium (pure iridium or iridium alloy) in a high-temperature atmosphere, crystal grain boundaries often serve as original points. Specifically, in a high-temperature atmosphere, iridium is consumed with oxidation (corrosion) occurring preferentially at grain boundaries, and tends to be ruptured at grain boundaries because the strength significantly decreases at grain boundaries.

A mechanism in which iridium is degraded preferentially at grain boundaries as described above is also pointed out in Patent Document 1. In the iridium wire rod in Patent Document 1, degradation at grain boundaries is suppressed by improvement of the crystal orientation based on the view that preferential degradation at grain boundaries is expanded by a difference in direction between adjacent crystals. The effectiveness of the considerations and measures in Patent Document 1 is not denied. However, regulation of the grain boundary area which is a factor of degradation may be a more effective strategy.

The present inventors considered that whether or not there is a change in material structure before and after heating at a high temperature should be determined for examining material properties in a high-temperature atmosphere. In Patent Document 1, the material structure (crystal orientation) of the iridium wire rod immediately after production is specified, but whether or not the material structure is maintained when exposed to a high temperature is not clarified. Here, since the iridium wire rod is expected to be used at a rather high temperature exceeding a recrystallization temperature, a change in structure due to recrystallization should be expected.

From the studies described above, the present inventors concluded that for improving the durability of an iridium wire rod in a high-temperature atmosphere, it is necessary that the grain boundary area be small, and also this state be maintained not only during production (at normal temperature) but also when the iridium wire rod is exposed to a high temperature, i.e. a change in structure by heating should be hard to occur. The present inventors then extensively conducted studies on such an iridium wire rod including a fundamental review on a production method, and discovered a suitable iridium wire rod.

Specifically, the present invention provides a metal wire rod composed of iridium or an iridium alloy, wherein the number of crystal grains on any cross-section in a longitudinal direction is 2 to 20 per 0.25 mm$^2$, and the Vickers hardness at any part is 200 Hv or more and less than 400 Hv.

In the present invention, the number of crystals in any region of a cross-section in a longitudinal direction is specified to regulate the surfaces of grain boundaries. For material containing iridium, grain boundaries serve as original points for high-temperature degradation damage as described above, and therefore the grain boundaries should be restricted.

In the present invention, the hardness of the iridium wire rod is specified, and the specification of the hardness is related to residual strain in the material. In production of an iridium wire rod, usually an ingot melted and cast is subjected to processing (hot processing or cold processing) in combination with a heat treatment. In the processing and heat treatment, introduction and release (removal) of processing strain alternately take place, and a material processed at a high processing ratio to the state of a wire rod accordingly includes residual strain. When the wire rod is heated to a temperature equal to or higher than a recrystallization temperature, the wire rod acts a driving force for recrystallization to change the material structure (recrystallized structure). The recrystallized structure increases the grain boundary area, so that high-temperature consumption and rupture are accelerated.

Therefore, an iridium wire rod expected to be used at a temperature equal to or higher than a recrystallization temperature is preferably one in which the number of crystal grains in the initial state (before use in a high-temperature atmosphere), and also, residual strain is reduced for suppressing a change in structure at a high temperature. The present invention has been made from these points of view, and will be described more in detail below.

The iridium wire rod of the present invention is composed of iridium or an iridium alloy. Here, the iridium alloy preferably contains at least any of platinum, ruthenium, rhodium, and nickel in a total amount of 1 to 50% by mass. By appropriately adding these additive elements, the high-temperature oxidation properties and mechanical properties of iridium may be further improved.

In the iridium wire rod of the present invention, the number of crystals per cross-sectional area of 0.25 mm$^2$ should be 2 or more and 20 or less on any cross-section in the longitudinal direction. The reason for specifying the number of crystals is as described above, and when the number of crystals is more than 20, the area of grain boundaries which serve as original points for degradation at a high temperature increases to raise the possibility that the oxidative consumption amount increases and the material is ruptured. Therefore, the upper limit of the number of crystals is 20. The number of crystals being 1 means a single-crystal state, which is of course desirable, but it is not practical to provide the requirement of having a single crystal when industrial production of the iridium wire rod is required. The "longitudinal direction" is a direction parallel to the center axis of the wire rod. In the present invention, the number of crystal grains on a cross-section in the longitudinal direction is specified, but the number of crystal grains on a cross-section in the radial direction is not limited.

In the present invention, the crystal grain is preferably in the form of a columnar crystal extending in the longitudinal direction, and the wire rod is preferably one having a material structure in which columnar crystals are bundled on any cross-section. A material structure having a small number equiaxial crystals is preferable. Specifically, the number of crystal grains in which the aspect ratio (y/x) based on a longitudinal direction (x) and a direction (y) vertical to the longitudinal direction is 1.5 or more is preferably 20 or less in a cross-sectional area of 0.25 mm$^2$. The purpose for limiting the ratio of equiaxial crystals is to suppress a reduction in mechanical strength due to an increase in grain boundary area.

The iridium wire rod of the present invention should have a material hardness of 200 Hv or more and less than 400 Hv in terms of the Vickers hardness. The reason for specifying the material hardness is as described above. Studies by the present inventors show that a wire rod having a hardness of 400 Hv or more has excessive residual strain, and when the wire rod is exposed to a high temperature equal to or higher than a recrystallization temperature, the grain boundary area may increase due to recrystallization, leading to an increase in oxidative consumption amount. The material is softened due to recrystallization, and the reduction in hardness/strength is combined with an increase in grain boundary area to increase the possibility that material rupture occurs with grain boundaries as original points. On the other hand, use of an iridium wire rod having a hardness of less than 200 Hv is not preferable because it does not have a required strength in a normal temperature range.

For obtaining a wire rod having a limited material hardness as described above, it is necessary to perform processing and production in such a manner as to obtain a necessary wire diameter while limiting processing conditions so that strain does not remain, and this production process will be described later. The present invention provides a wire rod composed of iridium or an iridium alloy, and the "wire rod" in the present invention is intended to be a fine wire rod having a wire diameter of 0.1 mm or more and 3.0 mm or less.

Thus, in the iridium wire rod of the present invention, the number of crystals at normal temperature is limited, and a variation in structure due to recrystallization is hard to occur even when the iridium wire rod is heated at a high temperature. Therefore, the iridium wire rod of the present invention has a small variation in the number of crystal grains when heated to a temperature equal to or higher than a recrystallization temperature (1200° C. to 1500° C., although varying depending on the material composition). Further, a change in hardness due to heating at a high temperature is suppressed, and specifically, when, as heating conditions, the heating temperature is set to 1200° C. and the heating time is set to 20 hours, the rate of change in hardness before and after heating (100(%)−(hardness after heating/hardness before heating×100)) is 15% or less.

A method for producing the iridium wire rod of the present invention will now be described. As described above, in the iridium wire rod of the present invention, it is necessary to limit the number of crystal grains, and limit the material hardness for reducing residual strain. These limitations are difficult to achieve in conventional wire rod production processes. In conventional wire rod production processes, a melted and cast ingot is molded into a fine wire by performing rolling processing (grooved roll rolling processing), wire drawing processing and so on, and in these production steps, the number of crystal grains cannot be controlled. In the process of molding the ingot into the wire rod, processing is performed at a considerably high processing ratio, and therefore residual strain exists. Residual strain can be reduced by performing processing in a hot process, but nevertheless, considerable residual strain exists due to repeated processing. Accordingly, the present inventors applied a micro-pull-down method (hereinafter, referred to as a μ-PD method), which is one aspect of a single-crystal production process, as a wire rod production process capable of achieving both limitation of the number of crystal grains and suppression of residual strain which are required in the present invention.

The μ-PD method is a method in which a molten metal as a raw material is placed in a crucible with a nozzle provided on the bottom, and the metal solidified via growing crystals is caused to pass through the nozzle, and simultaneously pulled down to perform crystal growth. The method of the present invention is intended to obtain a wire rod by continuously performing the crystal growth.

The reason why the μ-PD method is suitably applied for production of the iridium wire rod of the present invention is that first, the μ-PD method is capable of producing a single-crystal-like material having a small number of crystal grains while controlling the shape of crystal grains. Further, in the μ-PD method, crystal growth is performed while the cross-sectional area is limited to a very small area by a nozzle, and therefore a wire rod produced by this method has a small wire diameter, and does not require subsequent processing, or a wire rod having a desired wire diameter can be obtained in a small number of times of processing. Therefore, crystals grown in the μ-PD method do not require additional processing because they have reduced strain. Accordingly, residual strain can be considerably reduced, so that an iridium wire rod having a low hardness as required in the present invention can be obtained. Thus, production of a wire rod using the μ-PD method is an efficient process capable of producing an intended wire rod in a near-net shape.

In the method for producing the iridium wire rod of the present invention based on the μ-PD method, iridium or an alloy thereof that is a high-melting-point material is handled, and therefore as a constituent material of the crucible, one that is hard to be melted and volatilized at a high temperature is required, and specifically, a ceramic such as magnesia, zirconia or alumina, carbon (graphite) or the like is used. The crucible in the μ-PD method includes a nozzle on the bottom thereof. The nozzle has both a function of cooling a passing molten metal from the bottom to solidify the molten metal and a function of confining and molding the solidified metal as a jig (die). Preferably, the nozzle is formed of a material that is hard to be melted and volatilized at a high temperature like the crucible. Preferably, the surface of the nozzle inner wall is smooth because the inner wall of the nozzle causes friction between itself and the solidified metal.

One of important factors when the iridium wire rod having a limited number of crystal grains of the present invention is produced by the μ-PD method is a position (level) of a solid-liquid interface between a molten metal and a solidified metal. Preferably, the solid-liquid interface is positioned around the center in the vertical direction of the nozzle. When the solid-liquid interface is positioned on the upper side (crucible side), the moving distance of the solidified metal increases, and the pull-down resistance accordingly increases, so that the nozzle is worn and damaged, thus making it difficult to control the shape and dimension of the wire rod. On the other hand, when the solid-liquid interface is positioned on the lower side (nozzle outlet side), the hot metal may be discharged from the nozzle, leading to an increase in wire diameter of the wire rod. The level of the solid-liquid interface is controlled by appropriately adjusting the length (thickness) of the nozzle and the pull-down speed. In production of a wire rod having a wire diameter expected in the present invention, the length (thickness) of the nozzle is preferably 5 to 30 mm, and accordingly the pull-down speed is preferably 0.5 to 200 mm/min.

In production of an iridium wire rod by the μ-PD method, the cooling rate of the wire rod discharged from the nozzle is also necessary. The wire rod discharged from the nozzle is in a solid phase domain, but fine crystals (equiaxial crystals) may be generated when the wire rod is rapidly cooled. Therefore, preferably, the wire rod discharged from the nozzle is slowly cooled at a slow cooling rate in a section where the temperature of the wire rod decreases to be equal to or lower than the recrystallization temperature. Specifically, the cooling rate is preferably 120° C./sec to 1° C./sec until the temperature of the wire rod decreases to 1200° C. or lower. In the wire rod temperature range of not higher than 1200° C., the wire rod may be cooled at the gentle cooling rate, but when the wire rod temperature is 1000° C. or lower, the cooling rate may be made higher than the above-mentioned rate with production efficiency taken into consideration. For adjustment of the cooling rate, for example, a barrel (after-heater) formed of a heat conduction material such as a ceramic may be coupled to the crucible at the lower part of the crucible to utilize heat from the crucible (molten metal). Preferably, treatment of the molten metal with the crucible and pull-down of the wire rod are performed in an inert gas (nitrogen, argon, helium or the like) atmosphere for prevention of oxidation.

For the iridium wire rod produced by the μ-PD method, the wire diameter may be adjusted by additional processing. In this case, attention should be paid to the processing temperature and the processing ratio so that residual strain does not remain. Specifically, the processing temperature should be 1500° C. or higher, and the processing ratio per one time (one pass) should be less than 12%. When the processing temperature is low or the processing ratio is high, residual strain remains, so that a change in structure due to recrystallization occurs at the time when the wire rod is used at a high temperature. The iridium wire rod of the present invention, which is produced by the μ-PD method described above, can be appropriately cut according to the use purpose of the iridium wire rod.

The iridium wire rod of the present invention can also be produced based on a single-crystal production process other than the μ-PD method, such as a CZ method (Czochralski method). However, such a single-crystal growth method is suitable for production of single crystals having a larger diameter as compared to crystals produced by the μ-PD method, but in the CZ method (Czochralski method), a continuous wire rod having a diameter of φ 3 mm or less cannot be prepared in a near-net shape. When the CZ method etc. is applied to produce a wire rod having a small diameter of 3 mm or less as a final product, a plurality of times of processing must be performed after the CZ method. A plurality of times of processing raise the possibility that residual strain remains, and the processed wire rod has a hardness Hv of 400 or more. When the processed wire rod is adjusted to have a hardness Hv of less than 400 by a heat treatment etc., a recrystallized structure composed of equiaxial crystals is formed, so that mechanical properties, particularly stiffness, are extremely deteriorated.

Advantageous Effects of the Invention

A metal wire rod composed of iridium or an iridium alloy of the present invention has a reduced grain boundary area, so that residual amount damage occurring with grain boundaries as original points is suppressed. The wire rod of the present invention has limited residual strain, and is therefore hard to suffer a change in structure due to recrystallization and an increase in grain boundaries serving as original points for damage even when used at a high temperature. Accordingly, the wire rod is excellent in properties such as oxidative consumption resistance and mechanical properties.

DESCRIPTION OF EMBODIMENT

Hereinafter, preferred examples of the present invention will be described. In this embodiment, wire rods formed of iridium and various kinds of iridium alloys were produced by a μ-PD method (Examples 1 to 10). As conventional iridium wire rods, iridium wire rods having the same compositions as in examples were produced in a production process with processing in combination with a heat treatment as described in Patent Document 1 (Comparative Examples 1 to 10). Further, as reference examples, an ingot produced by a CZ method was processed and heat-treated to produce a wire rod. Hereinafter, processes for production of the iridium wire rods of examples, comparative examples and reference examples will be described.

Examples 1 to 10

Figure 1:
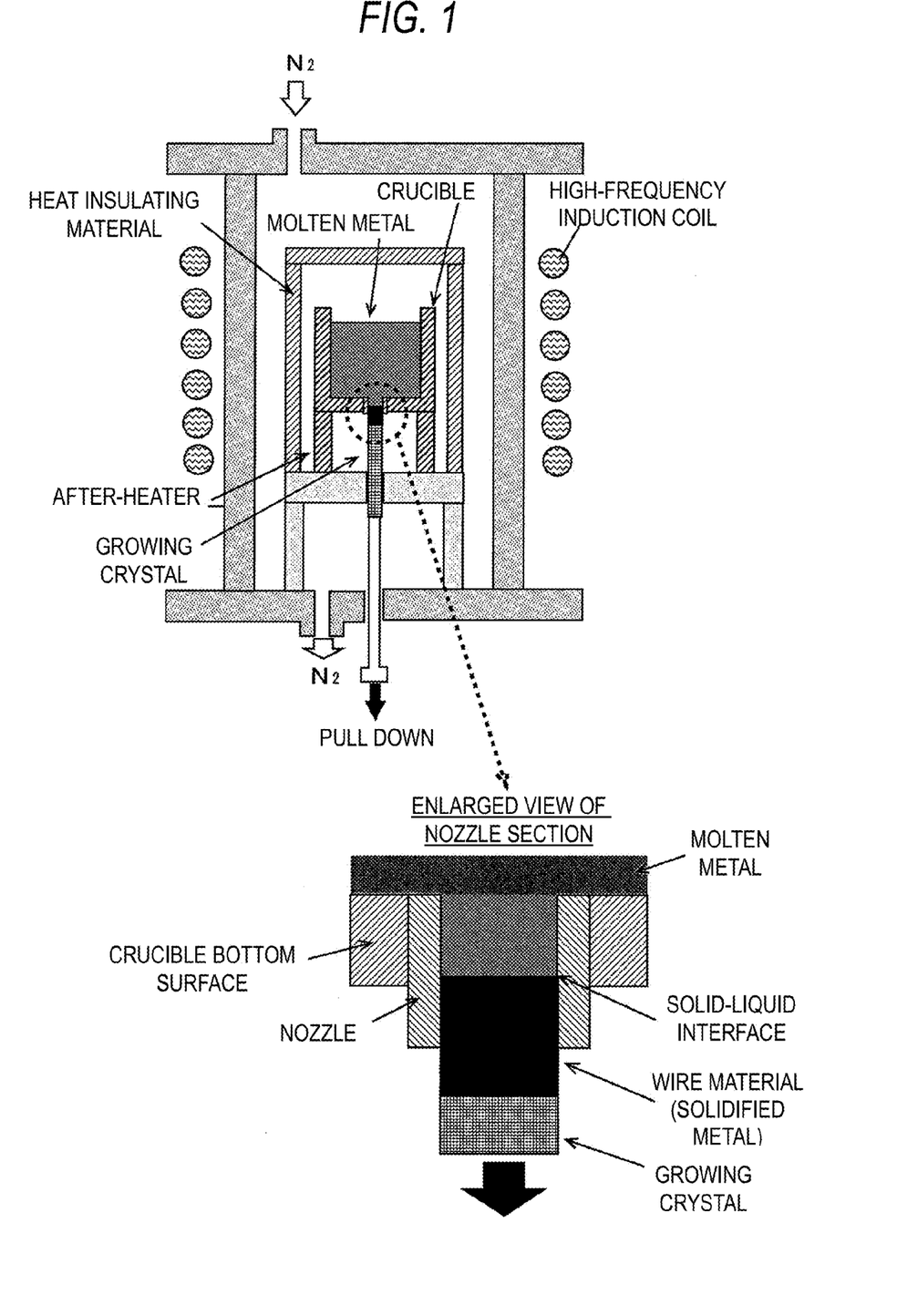
FIG. 1 is a view explaining a configuration of an apparatus for producing an iridium wire rod based on a μ-PD method.

FIG. 1 illustrates an apparatus for producing an iridium wire rod based on the μ-PD method as applied in this embodiment. In the apparatus for producing an iridium wire rod, a molten iridium raw material is placed in a crucible as shown in FIG. 1. A die having a though-hole is embedded at the bottom of the crucible. In production of a wire rod by the μ-PD method, first a growing crystal is brought into contact with the raw material in the crucible from the bottom, and the growing crystal is then pulled down (moved downward) at a constant speed.

In this embodiment, iridium or an iridium alloy (each having a purity of 99% or more) provided beforehand was placed in a zirconia crucible (container dimension: 40×30× 50). On the other hand, the growing crystal (seed crystal of ϕ 0.8 mm) was introduced from below a nozzle (dimension: 1 mm (inner diameter)×5 mm (length)) provided on the bottom of the crucible. The raw material was melted by high frequency induction heating. Thereafter, the raw material was pulled down at a pull-down speed of 5 mm/min. At this time, a nitrogen gas (1 L/min) was fed downward from the upper part of the crucible. In this embodiment, cooling was performed slowly at a cooling rate of 50° C./sec until the wire rod temperature decreased to 1200° C. in a section of 30 mm from the nozzle outlet. In this way, a wire rod having a wire diameter of 1 mm and a length of 150 mm was produced.

Comparative Examples 1 to 10

Figure 2:
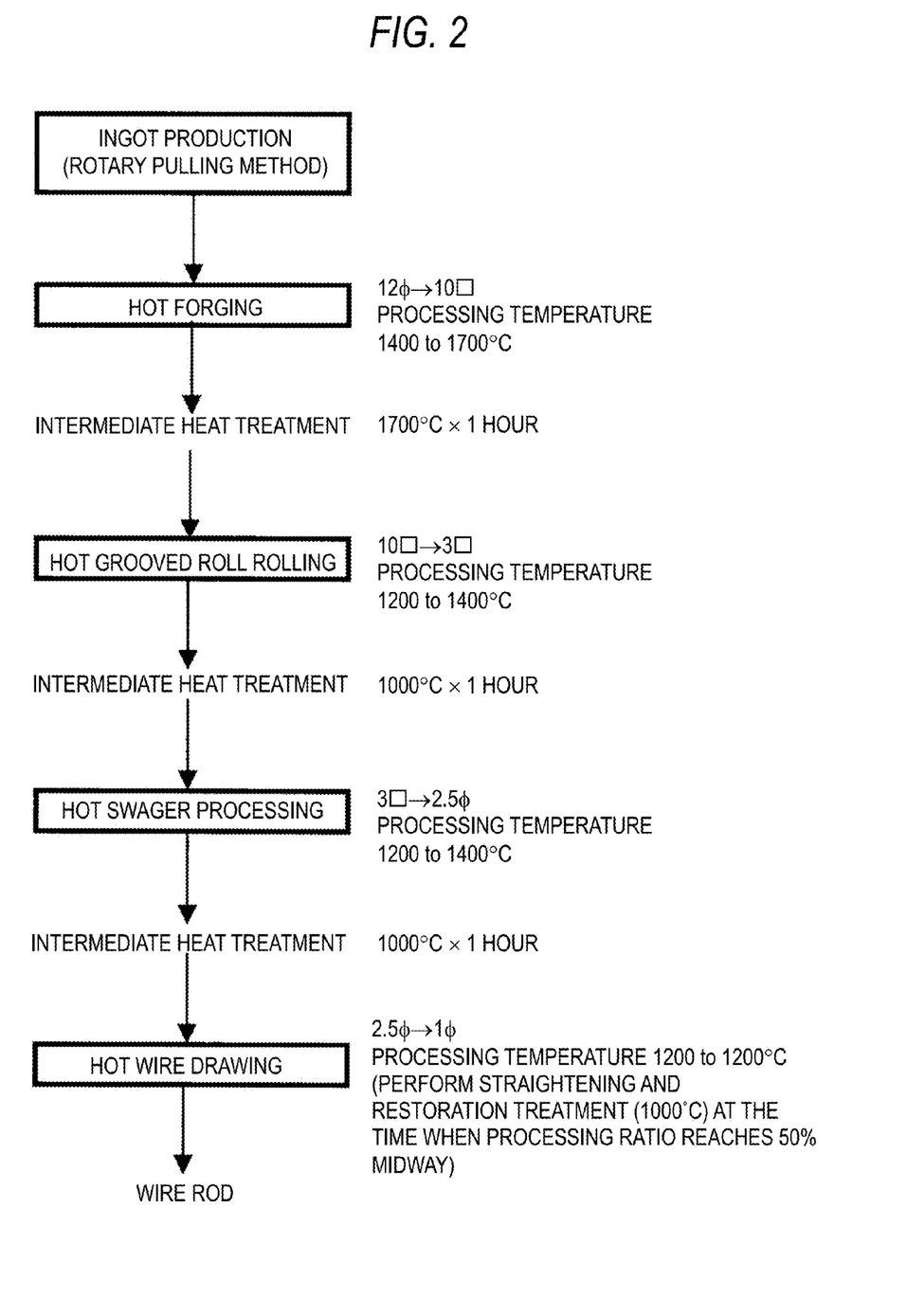
FIG. 2 is a view explaining a process for production of an iridium wire rod of comparative examples.

An ingot (diameter: 12 mm) composed of iridium or an iridium alloy was produced by a nitrogen arc melting method, and the ingot was processed into a wire rod by passing through the process shown in FIG. 2. In this processing process, processing is repeatedly performed until an intended dimension is obtained in each of the steps of hot forging and hot grooved roll rolling by biaxial pressurization. The repetition of biaxial pressurization in comparative examples is intended to impart a high orientation to the wire rod. In the processing process in comparative examples, the hot processing temperature and the heat treatment temperature are each set to a crystallization temperature or lower. Accordingly, rupture at grain boundaries generated by recrystallization in the middle of processing is prevented.

Reference Examples 1 and 2

Iridium and iridium alloy ingots having a diameter of 5 mm were each produced by a CZ method (pull-up speed: 10 mm/min) from a high-frequency-melted iridium hot metal by use of a water-cooled copper mold. The wire rod was subjected to hot wire drawing processing to obtain a fine wire. For processing conditions at this time, the processing temperature was 1000° C. to 1200° C., and the processing ratio per one pass was 10%. The wire diameter of the wire rod was 1 mm. In the reference examples, wire rods were produced with two materials: pure iridium (corresponding to Example 1) and an iridium-rhodium alloy (corresponding to Example 5).

For the iridium wire rods produced as described above, measurement of the number of crystal grains by observation of the material structure and measurement of the hardness were first performed. For these measurements, the produced wire rod was cut to a length of 1 mm, and further cut into halves in the longitudinal direction. Microscopic observation was performed, where an observation field of view with an area of 0.25 mm$^2$ was arbitrarily set, and the number of crystal grains was measured. The presence/absence and the number of equiaxial crystals having an aspect ratio of 1.5 or more were determined. The Vickers hardness was then measured by a Vickers hardness meter. The results are shown in Table 1.

TABLE 1

|  | Composition | | | | | Production method | Observation results | | Hardness (Hv) |
| --- | --- | --- | --- | --- | --- | --- | --- | --- | --- |
|  | Ir | Pt | Rh | Ru | Ni |  | Number of crystal grains | Number of equiaxial crystals |  |
| Example 1 | 100 | — | — | — | — | μ-PD | 5 | 0 | 323 |
| Example 2 | Balance | 10 | — | — | — |  | 2 | 0 | 311 |
| Example 3 | Balance | 20 | — | — | — |  | 4 | 0 | 331 |
| Example 4 | Balance | 50 | — | — | — |  | 2 | 0 | 389 |
| Example 5 | Balance | — | 20 | — | — |  | 4 | 0 | 299 |
| Example 6 | Balance | — | — | 20 | — |  | 3 | 0 | 326 |
| Example 7 | Balance | — | — | — | 20 |  | 6 | 0 | 332 |
| Example 8 | Balance | 20 | 20 | — | — |  | 4 | 0 | 293 |
| Example 9 | Balance | — | 3 | — | — |  | 3 | 0 | 315 |

TABLE 1-continued

| | Composition | | | | | Production method | Observation results | | |
|---|---|---|---|---|---|---|---|---|---|
| | | | | | | | Number of crystal grains | Number of equiaxial crystals | Hardness (Hv) |
| | Ir | Pt | Rh | Ru | Ni | | | | |
| Example 10 | Balance | — | — | — | 1 | | 2 | 0 | 298 |
| Comparative Example 1 | 100 | — | — | — | — | Processing + heat treatment | 26 | 3 | 489 |
| Comparative Example 2 | Balance | 10 | — | — | — | | 23 | 5 | 561 |
| Comparative Example 3 | Balance | 20 | — | — | — | | 25 | 4 | 593 |
| Comparative Example 4 | Balance | 50 | — | — | — | | 34 | 4 | 490 |
| Comparative Example 5 | Balance | — | 20 | — | — | | 25 | 3 | 467 |
| Comparative Example 6 | Balance | — | — | 20 | — | | 28 | 3 | 666 |
| Comparative Example 7 | Balance | — | — | — | 20 | | 32 | 6 | 618 |
| Comparative Example 8 | Balance | 20 | 20 | — | — | | 38 | 5 | 462 |
| Comparative Example 9 | Balance | — | 3 | — | — | | 22 | 8 | 456 |
| Comparative Example 10 | Balance | — | — | — | 1 | | 29 | 6 | 527 |
| Reference Example 1 | 100 | — | — | — | — | CZ + processing | 16 | 2 | 510 |
| Reference Example 2 | Balance | — | 20 | — | — | | 14 | 2 | 400 |

The results for samples produced in this embodiment show that in Examples 1 to 10, the number of crystal grains on a cross-section in the longitudinal direction is in the specified range, and the hardness is relatively low. In comparative examples, the number of crystal grains is not excessively large, but is larger as compared to examples, and the hardness is high. In reference examples, the number of crystal grains is small because a CZ method is applied in ingot production, while the hardness is relatively high. This may be ascribable to conditions for subsequent processing (processing temperature is lower than 1400° C.).

Figure 3:
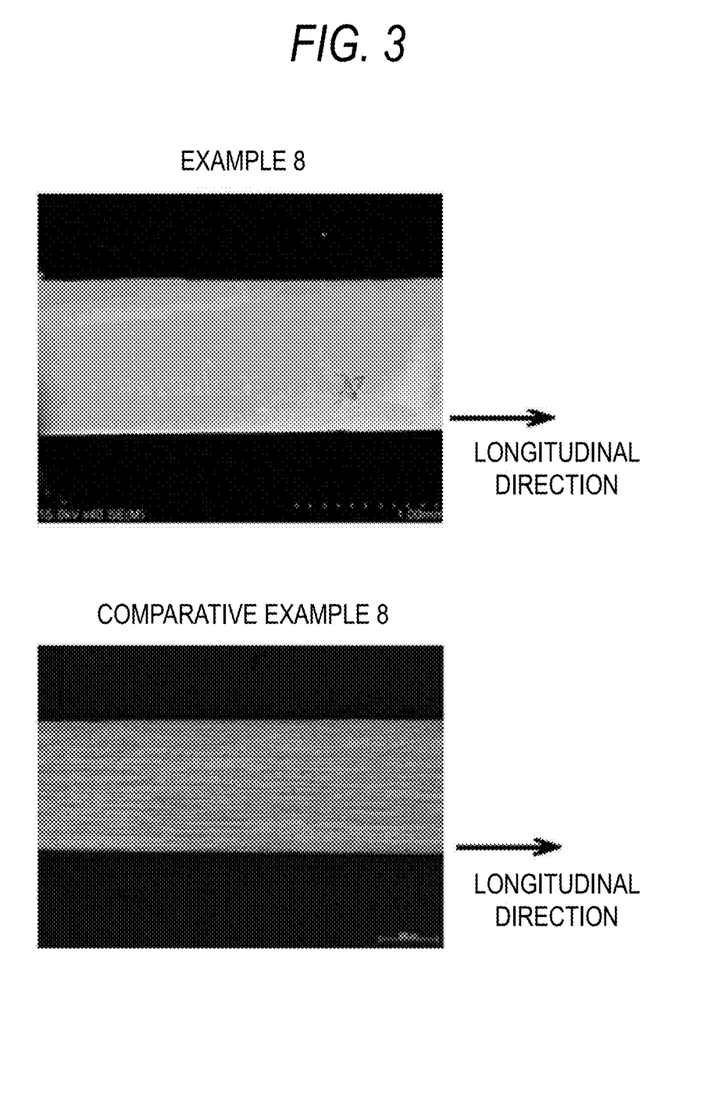
FIG. 3 shows photographs depicting the cross-section structures of wire rods of Example 8 and Comparative Example 8.

FIG. 3 depicts the cross-section structures of the wire rods of Example 8 and Comparative Example 8. The wire rod of Example 8 includes a small number of columnar crystals. On the other hand, the wire rod of Comparative Example 8 has a material structure in which a large number of crystals extending in the longitudinal direction are densely arranged in the form of fibers.

Next, each sample in Table 1 was subjected to oxidation heating at a high temperature, and a change in structure and a change in hardness after heating were examined. Further, the oxidative consumption amount after heating was measured, and high-temperature oxidation properties were evaluated. Wire rods (length: 10 mm) having the same compositions as in Table 1 were provided and heated at high temperature, and whether breakage occurred or not was determined in a bending test for the wire rods after heating. In this bending test, it was determined that breakage occurred when wire rod rupture or surface cracking occurred at the time of bending the wire rod to 90°. The results of the above evaluations are shown in Tables 2 and 3.

TABLE 2

| | Composition | | | | | Production method | Number of crystal grains | | | Hardness | | |
|---|---|---|---|---|---|---|---|---|---|---|---|---|
| | | | | | | | Before heating | 1200° C. | 1500° C. | Before heating | 1200° C. | 1500° C. |
| | Ir | Pt | Rh | Ru | Ni | | | | | | | |
| Example 1 | 100 | — | — | — | — | μ-PD | 5 | 5 | 6 | 323 | 280 | 288 |
| Example 2 | Balance | 10 | — | — | — | | 2 | 3 | 3 | 311 | 288 | 297 |
| Example 3 | Balance | 20 | — | — | — | | 4 | 4 | 3 | 331 | 318 | 288 |
| Example 4 | Balance | 50 | — | — | — | | 2 | 4 | 2 | 389 | 355 | 342 |
| Example 5 | Balance | — | 20 | — | — | | 4 | 3 | 8 | 299 | 255 | 221 |
| Example 6 | Balance | — | — | 20 | — | | 3 | 6 | 2 | 326 | 289 | 288 |
| Example 7 | Balance | — | — | — | 20 | | 6 | 8 | 9 | 332 | 284 | 275 |
| Example 8 | Balance | 20 | 20 | — | — | | 4 | 8 | 2 | 293 | 255 | 242 |
| Example 9 | Balance | — | 3 | — | — | | 3 | 4 | 2 | 315 | 283 | 267 |
| Example 10 | Balance | — | — | — | 1 | | 2 | 3 | 4 | 298 | 274 | 276 |
| Comparative Example 1 | 100 | — | — | — | — | Processing + heat treatment | 26 | 80 | 46 | 489 | 243 | 259 |
| Comparative Example 2 | Balance | 10 | — | — | — | | 23 | 175 | 31 | 561 | 285 | 271 |
| Comparative Example 3 | Balance | 20 | — | — | — | | 25 | 100 | 35 | 593 | 342 | 333 |

TABLE 2-continued

|  | Composition | | | | | Production method | Number of crystal grains | | | Hardness | | |
|---|---|---|---|---|---|---|---|---|---|---|---|---|
|  | Ir | Pt | Rh | Ru | Ni | | Before heating | 1200° C. | 1500° C. | Before heating | 1200° C. | 1500° C. |
| Comparative Example 4 | Balance | 50 | — | — | — | | 34 | 175 | 42 | 490 | 447 | 493 |
| Comparative Example 5 | Balance | — | 20 | — | — | | 25 | 45 | 31 | 467 | 261 | 256 |
| Comparative Example 6 | Balance | — | — | 20 | — | | 28 | 46 | 38 | 666 | 331 | 282 |
| Comparative Example 7 | Balance | — | — | — | 20 | | 32 | 115 | 48 | 618 | 314 | 346 |
| Comparative Example 8 | Balance | 20 | 20 | — | — | | 38 | 47 | 41 | 462 | 271 | 232 |
| Comparative Example 9 | Balance | — | 3 | — | — | | 22 | 52 | 29 | 456 | 245 | 256 |
| Comparative Example 10 | Balance | — | — | — | 1 | | 29 | 65 | 52 | 527 | 352 | 335 |
| Reference Example 1 | 100 | — | — | — | — | CZ + processing | 16 | 35 | 29 | 510 | 340 | 430 |
| Reference Example 2 | Balance | — | 20 | — | — | | 14 | 25 | 23 | 400 | 300 | 310 |

TABLE 3

|  | Composition | | | | | Production method | Oxidative consumption (%) | | Presence/absence of breakage | |
|---|---|---|---|---|---|---|---|---|---|---|
|  | Ir | Pt | Rh | Ru | Ni | | 1200° C. | 1500° C. | 1200° C. | 1500° C. |
| Example 1 | 100 | — | — | — | — | μ-PD | 38.55 | 60.58 | ○ | ○ |
| Example 2 | Balance | 10 | — | — | — | | 36.45 | 56.23 | ○ | ○ |
| Example 3 | Balance | 20 | — | — | — | | 32.34 | 47.15 | ○ | ○ |
| Example 4 | Balance | 50 | — | — | — | | 26.31 | 24.32 | ○ | ○ |
| Example 5 | Balance | — | 20 | — | — | | 0.93 | 7.67 | ○ | ○ |
| Example 6 | Balance | — | — | 20 | — | | 67.20 | 83.45 | ○ | ○ |
| Example 7 | Balance | — | — | — | 20 | | 0.48 | 4.46 | ○ | ○ |
| Example 8 | Balance | 20 | 20 | — | — | | 3.64 | 11.25 | ○ | ○ |
| Example 9 | Balance | — | 3 | — | — | | 26.30 | 42.56 | ○ | ○ |
| Example 10 | Balance | — | — | — | 1 | | 23.45 | 36.35 | ○ | ○ |
| Comparative Example 1 | 100 | — | — | — | — | Processing + heat treatment | 42.69 | 64.19 | x | x |
| Comparative Example 2 | Balance | 10 | — | — | — | | 47.78 | 58.65 | x | x |
| Comparative Example 3 | Balance | 20 | — | — | — | | 37.54 | 49.37 | x | x |
| Comparative Example 4 | Balance | 50 | — | — | — | | 51.78 | 27.56 | x | x |
| Comparative Example 5 | Balance | — | 20 | — | — | | 5.32 | 11.56 | x | x |
| Comparative Example 6 | Balance | — | — | 20 | — | | 72.56 | 87.04 | x | x |
| Comparative Example 7 | Balance | — | — | — | 20 | | 6.20 | 8.30 | x | x |
| Comparative Example 8 | Balance | 20 | 20 | — | — | | 8.12 | 13.53 | x | x |
| Comparative Example 9 | Balance | — | 3 | — | — | | 28.90 | 46.20 | x | x |
| Comparative Example 10 | Balance | — | — | — | 1 | | 28.52 | 41.76 | x | x |
| Reference Example 1 | 100 | — | — | — | — | CZ + processing | 43.20 | 63.50 | Δ | x |
| Reference Example 2 | Balance | — | 20 | — | — | | 3.66 | 7.54 | Δ | x |

○: Material rupture and surface cracking were not observed.
x: Material rupture and surface cracking were observed.
Δ: Rupture and cracking were not observed, but wrinkles occured on the surface.

From Table 3, it can be confirmed that the iridium wire rods of examples are superior in oxidative consumption and high-temperature strength to the wire rods of comparative examples which have the same compositions. Breakage occurring in comparative examples was found to be grain boundary cracking in observation of the ruptured part. For oxidative consumption, intensive corrosion occurred around grain boundaries. In this respect, Table 2 shows that in the iridium wire rods of examples, a change in the number of crystal grains is small, and a change in hardness is suppressed. In comparative examples, recrystallization is promoted by heating at a high temperature, so that the material is considerably softened while the number of crystal grains increases.

Figure 4:
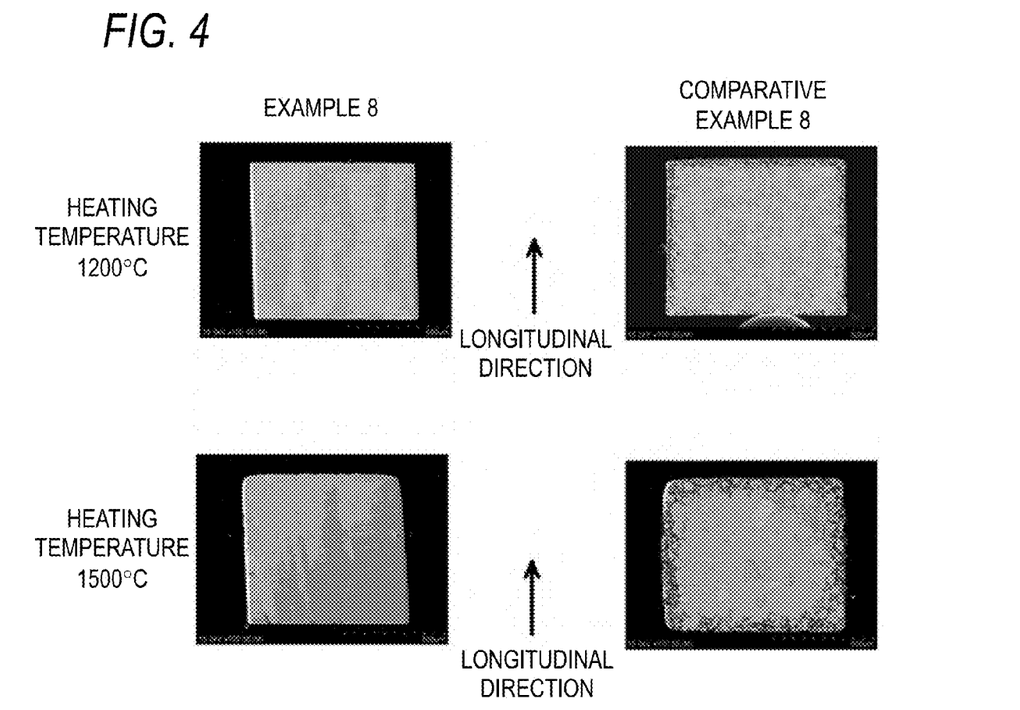
FIG. 4 shows photographs depicting material structures after the wire rods of Example 8 and Comparative Example 8 are heated at a high temperature.

FIG. 4 depicts the material structures in Example 8 and Comparative Example 8 after heating at a high temperature (1200° C. and 1500° C.). In the comparative example, the number of crystal grains increases due to recrystallization after heating at a high temperature. Particularly, the number of crystal grains on the outer peripheral section markedly increases. On the other hand, in Example 8, a change in material structure is extremely small.

Figure 5:
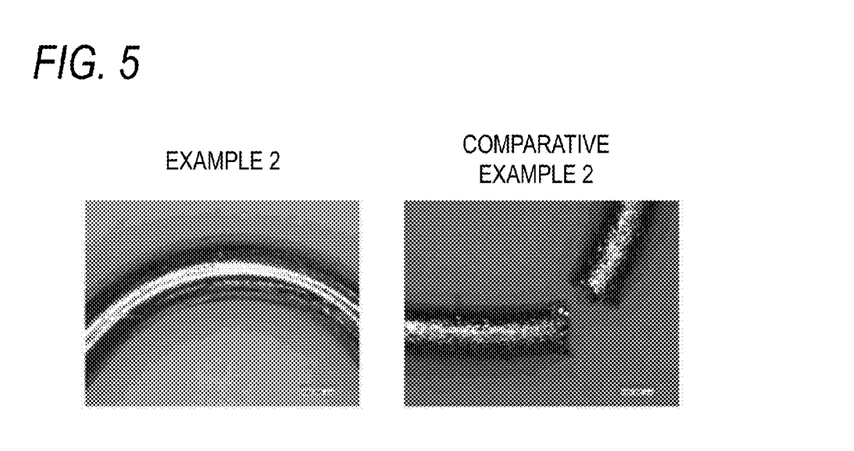
FIG. 5 shows photographs of wire rods of Example 2 and Comparative Example 2 after heating at a high temperature and a bending test.

FIG. 5 shows photographs of external appearances in a bending test conducted after heating at a 1500° C. for 20 hours for the wire rods of Example 2 and Comparative Example 2. In the comparative example, evident rupture was observed. Further, in the comparative example, roughnesses were observed in the surface form. On the other hand, the wire rod of the example was bent without being ruptured, and had a glossy surface.

The high-temperature properties in Reference Examples 1 and 2 are superior to those in Comparative Examples 1 and 5 which have the same compositions, but are inferior to those in Examples 1 and 5. Reference examples which apply a CZ method are superior to comparative examples as to material structure control. However, it is considered that in reference examples, the processing temperature was low and the plastic processing ratio was high, so that residual strain existed, and caused slight recrystallization.

INDUSTRIAL APPLICABILITY

The present invention provides a material which has a satisfactory high-temperature oxidation resistance property, and is thus capable of being used for a long period of time under a high-temperature oxidizing atmosphere. The material of the present invention is suitable as a material for ignition plug electrodes, various kinds of sensor electrodes, lead wires and the like, which is used under a high-temperature oxidizing atmosphere.

The invention claimed is:

1. A metal wire rod composed of iridium or an iridium alloy, wherein the number of crystal grains on all cross-sections parallel to the longitudinal direction is 2 to 20 per 0.25 mm$^2$, wherein the wire rod has a Vickers hardness of 200 Hv or more and less than 400 Hv.

2. The metal wire rod according to claim 1, wherein the number of crystal grains in which the aspect ratio (x/y) based on a longitudinal direction (x) and a direction (y) vertical to the longitudinal direction is 1.5 or more is 20 or less per 0.25 mm$^2$ on all cross-sections parallel to the longitudinal direction.

3. The metal wire rod according to claim 1, wherein the iridium alloy is at least any of an iridium alloy containing platinum, ruthenium, rhodium, and nickel in a total amount of 1 to 50% by mass.

4. A method for producing the metal wire rod, the wire rod being defined in claim 1, comprising the steps of:

(a) providing a raw material made of a molten metal of iridium or an iridium-containing alloy in a molten state in a crucible having a nozzle serving as a die at a bottom of the crucible;
(b) bringing a growing crystal into contact with the molten metal contained in the crucible from the bottom;
(c) pulling the growing crystal downwardly away from the crucible at a constant speed through the nozzle at the bottom of the crucible to cool and to solidify the molten metal and thereby forming the wire rod;
(d) adjusting a pull-down speed of the growing crystal so that a solid-liquid interface between the molten metal and the solidified metal is around the center in a vertical direction of the nozzle; and
(e) adjusting a cooling rate of the wire rod to 120° C./sec to 1° C./sec until the temperature of the wire rod discharged from the nozzle becomes 1200° C. or lower.

5. The metal wire rod according to claim 2, wherein the iridium alloy is at least any of an iridium alloy containing platinum, ruthenium, rhodium, and nickel in a total amount of 1 to 50% by mass.

6. A method for producing the metal wire rod, the wire rod being defined in claim 2, comprising the steps of:

(a) providing a raw material made of a molten metal of iridium or an iridium-containing alloy in a molten state in a crucible having a nozzle serving as a die at a bottom of the crucible;
(b) bringing a growing crystal into contact with the molten metal contained in the crucible from the bottom ;
(c) pulling the growing crystal downwardly away from the crucible at a constant speed through the nozzle at the bottom of the crucible to cool and to solidify the molten metal and thereby forming the wire rod;
(d) adjusting a pull-down speed of the growing crystal so that a solid-liquid interface between the molten metal and the solidified metal is around the center in a vertical direction of the nozzle; and
(e) adjusting a cooling rate of the wire rod to 120° C./sec to 1° C./sec until the temperature of the wire rod discharged from the nozzle becomes 1200° C. or lower.

7. A method for producing the metal wire rod, the wire rod being defined in claim 3, comprising the steps of:

(a) providing a raw material made of a molten metal of an iridium-containing alloy in a molten state in a crucible having a nozzle serving as a die at a bottom of the crucible;
(b) bringing a growing crystal into contact with the molten metal contained in the crucible from the bottom;
(c) pulling the growing crystal downwardly away from the crucible at a constant speed through the nozzle at the bottom of the crucible to cool and to solidify the molten metal and thereby forming the wire rod;
(d) adjusting a pull-down speed of the growing crystal so that a solid-liquid interface between the molten metal and the solidified metal is around the center in a vertical direction of the nozzle; and
(e) adjusting a cooling rate of the wire rod to 120° C./sec to 1° C./sec until the temperature of the wire rod discharged from the nozzle becomes 1200° C. or lower.

* * * * *